US012047758B2

(12) United States Patent
Dhanasekaran

(10) Patent No.: US 12,047,758 B2
(45) Date of Patent: Jul. 23, 2024

(54) AUDIO GROUND SWITCH CHANNEL CROSSTALK CANCELLATION TECHNIQUE

(71) Applicant: QUALCOMM Incorporated, San Diego, CA (US)

(72) Inventor: Vijayakumar Dhanasekaran, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 221 days.

(21) Appl. No.: 17/580,505

(22) Filed: Jan. 20, 2022

(65) Prior Publication Data

US 2023/0232155 A1 Jul. 20, 2023

(51) Int. Cl.
*H04R 5/04* (2006.01)
*H03F 3/45* (2006.01)
*H04R 3/04* (2006.01)

(52) U.S. Cl.
CPC ............... *H04R 5/04* (2013.01); *H04R 3/04* (2013.01); *H03F 3/45475* (2013.01); *H04R 2420/03* (2013.01)

(58) Field of Classification Search
CPC ........ H04R 5/04; H04R 3/04; H04R 2420/03; H04R 2420/09; H04R 5/00; H03F 3/45475; H04S 1/005; H04S 5/005
USPC .................... 381/1, 17–18, 28, 74, 111, 120, 381/94.1–94.8
See application file for complete search history.

(56) References Cited

U.S. PATENT DOCUMENTS

| 6,009,178 | A  | * | 12/1999 | Abel ........................ H04R 5/04 381/1 |
| 6,856,046 | B1 |   | 2/2005  | Scarlett et al. |
| 7,450,726 | B2 |   | 11/2008 | Goyal |
| 7,912,501 | B2 |   | 3/2011  | Johnson et al. |
| 8,133,073 | B2 |   | 3/2012  | Buchberger et al. |
| 8,150,046 | B2 |   | 4/2012  | Hansson et al. |
| 8,917,882 | B2 |   | 12/2014 | Miao et al. |
| 9,338,570 | B2 | * | 5/2016  | Holzmann ........... H04R 29/004 |

(Continued)

FOREIGN PATENT DOCUMENTS

| CN | 101719610 A | 6/2010 |
| CN | 201781618 U | 3/2011 |

(Continued)

OTHER PUBLICATIONS

International Search Report and Written Opinion—PCT/US2023/010123—ISA/EPO—Apr. 11, 2023.

*Primary Examiner* — Xu Mei
(74) *Attorney, Agent, or Firm* — Loza & Loza, LLP

(57) ABSTRACT

An aspect of the disclosure relates to an apparatus, including an audio interface including first and second outputs; a crosstalk cancelling circuit including first and second inputs coupled to the first and second outputs of the audio interface, respectively; a first summer including a first input coupled to the first output of the audio interface and a second input coupled to a first output of the crosstalk cancelling circuit; a second summer including a first input coupled to the second output of the audio interface and a second input coupled to a second output of the crosstalk cancelling circuit; a first digital to analog converter (DAC) including an input coupled to an output of the first summer; and a second DAC including an input coupled to an output of the second summer.

19 Claims, 4 Drawing Sheets

(56) References Cited

U.S. PATENT DOCUMENTS

| | | |
|---|---|---|
| 9,936,317 B2 | 4/2018 | Maher et al. |
| 2008/0008325 A1 | 1/2008 | Holmstrom et al. |
| 2009/0130910 A1 | 5/2009 | Inha et al. |
| 2011/0079720 A1 | 4/2011 | Heidari |
| 2011/0268289 A1 | 11/2011 | Baranwal et al. |
| 2014/0093109 A1 | 4/2014 | Bazarjani et al. |
| 2016/0127828 A1* | 5/2016 | Maher ............... H04R 5/04 381/94.1 |
| 2016/0142810 A1* | 5/2016 | Freitas ............ H04F 1/1041 381/74 |
| 2017/0150258 A1* | 5/2017 | Wen ................ H04B 3/32 |
| 2017/0280244 A1 | 9/2017 | Scarlett et al. |
| 2018/0302733 A1* | 10/2018 | Majid ............... H04B 3/32 |
| 2021/0112339 A1 | 4/2021 | Seldess |
| 2021/0281949 A1 | 9/2021 | Guo |

FOREIGN PATENT DOCUMENTS

| | | |
|---|---|---|
| CN | 102404665 A | 4/2012 |
| EP | 2501114 B1 | 9/2013 |
| JP | H0638396 A | 2/1994 |
| JP | 2008098737 A | 4/2008 |
| WO | 2011079720 A1 | 7/2011 |

\* cited by examiner

US 12,047,758 B2

AUDIO GROUND SWITCH CHANNEL CROSSTALK CANCELLATION TECHNIQUE

FIELD

Aspects of the present disclosure relate generally to audio signal processing, and in particular, an audio ground switch channel crosstalk cancellation technique.

BACKGROUND

Audio over Universal Serial Bus (USB), type-C (referred to herein as "USB-C") is getting popular, especially in small form-factor devices, such as smart phones, tablet devices, smart watches, etc. USB-C connectors or ports are popular because a USB-C connector may be used for multiple purposes, such as transmitting analog or digital audio to headphones or speakers, transmitting and receiving USB data from USB devices, controlling battery chargers, transmitting multimedia data (e.g., DisplayPort data), and other functionality. Further, providing audio over USB-C in small form-factor devices allows these devices to eliminate the 3.5 millimeter (mm) jack typical used for sending analog audio to headphones or speakers.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. The apparatus includes an audio interface including first and second outputs; a crosstalk cancelling circuit including first and second inputs coupled to the first and second outputs of the audio interface, respectively; a first summer including a first input coupled to the first output of the audio interface and a second input coupled to a first output of the crosstalk cancelling circuit; a second summer including a first input coupled to the second output of the audio interface and a second input coupled to a second output of the crosstalk cancelling circuit; a first digital to analog converter (DAC) including an input coupled to an output of the first summer; and a second DAC including an input coupled to an output of the second summer.

Another aspect of the disclosure relates to a method. The method includes generating first and second channel digital audio signals; processing the first and second channel digital audio signals to generate first and second crosstalk-compensated digital audio signals; converting the first and second crosstalk-compensated digital audio signals into first and second analog audio signals, respectively; and providing the first and second analog audio signals to first and second speakers having common terminals coupled to ground via a ground switch, respectively.

Another aspect of the disclosure relates to an apparatus. The apparatus includes means for generating first and second channel digital audio signals; means for processing the first and second channel digital audio signals to generate first and second crosstalk-compensated digital audio signals; means for converting the first and second crosstalk-compensated digital audio signals into first and second analog audio signals, respectively; and means for providing the first and second analog audio signals to first and second speakers having common terminals coupled to ground via, a ground switch, respectively.

Another aspect of the disclosure relates to a wireless communication device. The wireless communication device includes at least one antenna; a transceiver coupled to the at least one antenna; one or more signal processing cores coupled to the transceiver; an audio interface including first and second outputs, wherein the audio interface is coupled to the one or more signal processing cores; a crosstalk cancelling circuit including first and second inputs coupled to the first and second outputs of the audio interface c, respectively; a first summer including a first input coupled to the first output of the audio interface and a first output of the crosstalk cancelling circuit; a second summer including a second input coupled to the second output of the audio interface and a second output of the crosstalk cancelling circuit; a first digital to analog converter (DAC) including an input coupled to an output of the first summer; and a second DAC including an input coupled to an output of the second summer.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figures 1A, 1B:
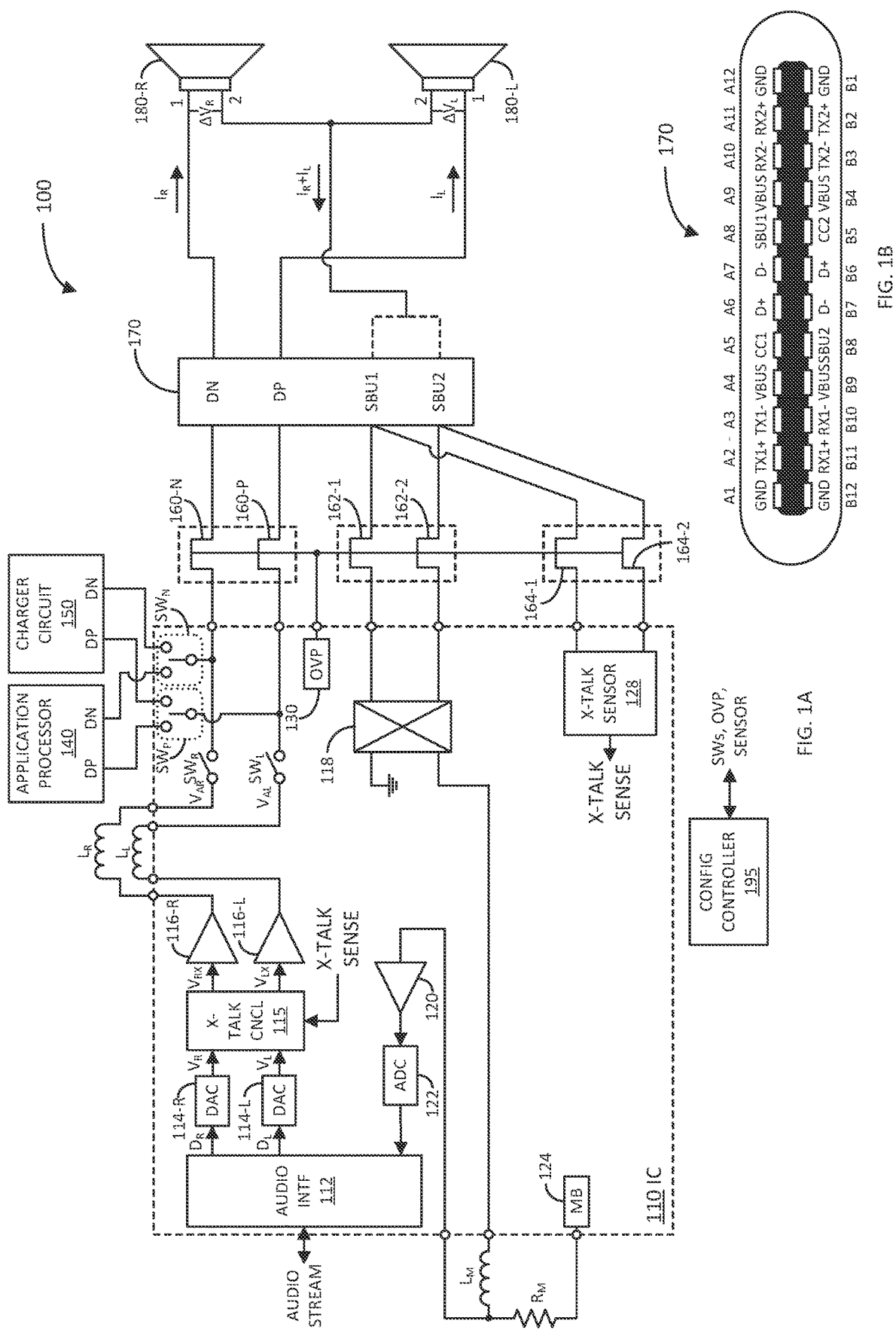
FIG. 1A illustrates a block/schematic diagram of an example Universal Serial Bus (USB) interface circuit in accordance with an aspect of the disclosure.
FIG. 1B illustrates a pin diagram of an example Universal Serial Bus (SB), type C (USB-C) connector in accordance with another aspect of the disclosure.

FIG. 1A illustrates a block/schematic diagram of an example Universal Serial Bus (USB) interface circuit 100 in accordance with an aspect of the disclosure. The USB interface circuit 100 is configured to provide analog audio to a pair of stereo right and left speakers 180-R and 180-L (e.g., headphones) via a USB connector 170. As used herein, the suffixes -R and -L refer to right and left audio channels, respectively. If the USB connector 170 is implemented as a USB-C connector, providing analog audio to the speakers 180-R and 180-L may be referred to as audio over USB-C or audio accessory mode.

The USB interface circuit 100 may also be configured to optionally transmit and/or receive other information to and/or from external devices connected to the USB connector 170. For example, the USB interface 100 may transmit and/or receive USB application data signal to and/or from external USB devices. The USB interface 100 may transmit and/or receive battery charging data signal to and/or from external battery chargers.

The USB interface circuit 100 may include an integrated circuit (IC) 110 (delineated by a dashed boundary box) including an audio interface (INTF) 112, stereo digital-to-analog converters (DACs) 114-R and 114-L, channel crosstalk (x-talk) canceller 115, stereo amplifiers 116-R and 116-L including off-chip inductors $L_R$ and $L_L$, and stereo switching devices $SW_R$ and $SW_L$. The audio interface 112 includes an input configured to receive an audio stream from, for example, a processor and/or memory device of a host device (e.g., a wireless communication device, smart phone, tablet device, laptop, desktop, or other device). The audio interface 112 generates stereo digital audio signals $D_R$ and $D_L$ at stereo outputs coupled to inputs of stereo DACs 114-R and 114-L based on the audio stream, respectively.

The stereo DACs 114-R and 114-L convert the stereo digital audio signals $D_R$ and $D_L$ into stereo analog audio signals $V_R$ and $V_L$ at outputs coupled to inputs of the channel crosstalk canceller 115, respectively. As discussed in more detail herein, the channel crosstalk canceller 115 is configured to process the stereo analog audio signals $V_R$ and $V_L$ to generate crosstalk-compensated stereo analog audio signals $V_{RX}$ and $V_{LX}$ with reduced stereo channel crosstalk. The stereo audio amplifiers 116-R and 116-L including the off-chip inductors $L_R$ and $L_L$ amplify the stereo analog audio signals $V_{RX}$ and $V_{LX}$ to generate amplified stereo analog audio signals $V_{AR}$ and $V_{AL}$ at first terminals of stereo switching devices $SW_R$ and $SW_L$, respectively.

The IC 110 further includes switching devices $SW_P$ and $SW_N$, where the "P" stands for the positive side of the USB differential data DP and the "N" stands for the negative side of the USB differential data. The switching devices $SW_P$ and $SW_N$ may each be implemented as a single pole double throw (SPDT) switch with an optional floating configuration. The switching devices $SW_P$ and $SW_N$ include poles coupled to second terminals of the stereo switching devices $SW_R$ and $SW_L$ (and pins of the IC 110, represented as solid circles at the dashed boundary of the IC 110), respectively. The switching devices $SW_P$ and $SW_N$ include first throws coupled to the positive data ports DP of an application processor 140 and charger circuit 150, respectively. The switching devices $SW_P$ and $SW_N$ include second throws coupled to the negative data ports DN of the application processor 140 and charger circuit 150, respectively.

As example operations, if the analog audio signals $V_{AR}$ and $V_{AL}$ are to be sent to speakers 180-R and 180-L, a configuration controller 195 selectively sets the stereo switching devices $SW_R$ and $SW_L$ in closed states, and switching devices $SW_P$ and $SW_N$ in floating states. In this configuration, the analog audio signals $V_{AR}$ and $V_{AL}$ are sent to speakers 180-R and 180-L via the closed stereo switching devices $SW_R$ and $SW_L$, overvoltage (OVP) switches 160-N and 160-P (e.g., field effect transistors (FETs)), respectively.

If USB application data signal is to be transmitted between the application processor 140 and a USB device connected to the USB connector 170, the configuration controller 195 selectively sets the stereo switching devices $SW_R$ and $SW_L$ in open states, and switching devices $SW_P$ and $SW_N$ such that their poles are connected to their first throws. In this configuration, USB application data signal DP and DN may be transmitted between the application processor 140 and the USB device via the switching devices $SW_P$ and $SW_N$, OVP switches 160-N and 160-P, and USB connector 170, respectively. If battery charging data signal is to be transmitted between the battery charger circuit 150 and a battery charger connected to the USB connector 170, the configuration controller 195 selectively sets the stereo switching devices $SW_R$ and $SW_L$ in open states, and switching devices $SW_P$ and $SW_N$ such that their poles are connected to their second throws. In this configuration, the battery charging data signal DP and DN is transmitted between the battery charger circuit 150 and the battery charger via the switching devices $SW_P$ and $SW_N$, OVP switches 160-N and 160-P, and USB connector 170, respectively.

The IC 110 further includes an overvoltage protection (OVP) circuit 130, a cross-coupling switching device 118, a microphone bias (MB) circuit 124, a microphone amplifier 120, and a microphone analog-to-digital converter (ADC) 122. The OVP circuit 130 is configured to control off-chip switches 160-N, 160-P, 162-1, 162-2, 164-1, and 164-2 (e.g., implemented as FETs) via a set of IC pins for the purpose of protecting the IC 110 against external overvoltage coming from the USB connector 170. That is, if the OVP circuit 130 senses overvoltage coming from the USB connector 170, the OVP circuit 130 may turn off the corresponding FETs 160-N, 160-P, 162-1, 162-2, 164-1, and 164-2 to prevent the overvoltage from propagating to and damaging the IC 110. Under normal operations, the FETs 160-N, 160-P, 162-1, 162-2, 164-1, and 164-2 are turned on.

The cross-coupling switching device 118 includes "input" terminals coupled to OVP FETs 162-1 and 162-2, respectively. The cross-coupling switching device 118 includes "output" terminals coupled to ground and an IC pin coupled to an off-chip inductor $L_M$. The MB circuit 124 is coupled to an off-chip resistor $R_M$ via another IC pin. The microphone amplifier 120 includes an input coupled to the off-chip inductor $L_M$ and resistor $R_M$ via another IC pin. The microphone amplifier 120 includes an output coupled to an input of the ADC 122. The ADC 122 includes an output coupled to an input of the audio interface 112.

With regard to microphone audio processing, an analog audio signal generated by a microphone, which may be associated with the speakers 180-R and 180-L (e.g., an integrated microphone of a headphone), is received via OVP FET 162-1 or 162-2, and routed to the off-chip inductor $L_M$ via the cross-coupling switching device 118. The inductor $L_M$ and resistor $R_M$ form a low pass filter (LPF) to remove high frequency noise from the microphone audio signal. The microphone bias circuit 124 adds a voltage offset to the microphone audio signal to set the dynamic range of the signal. The microphone amplifier 120 amplifies the microphone audio signal. The ADC 122 converts the microphone audio signal into a digital audio signal. The audio interface 112 converts the digital audio signal into an audio stream, and sends the audio stream to the processor and/or memory of the host device.

For crosstalk cancellation purposes, the IC 110 includes a crosstalk (x-talk) sensor 128 including inputs coupled to OVP FETs 164-1 and 164-2, and an output to produce a crosstalk sense signal, which is coupled to an input of the crosstalk canceller 115.

The USB connector 170 includes a negative differential data pin DN coupled to the OVP FET 160-N and to a first "1" terminal of the right speaker 180-R when the speaker is connected to the USB connector 170. The USB connector 170 includes a positive differential data pin DP coupled to the OVP FET 160-P and to a first "1" terminal of the left speaker 180-L when the speaker is connected to the USB connector 170. As mentioned, the USB connector 170 includes the SBU1 pin, which may be coupled to OVP FET 162-1 and to common (coupled together) second "2" terminals of the right and left speakers 180-R and 180-L or to a microphone (not shown) associated with the speakers 180-R and 180-L if the connection of the speakers to the USB connector 170 is in a first orientation. Also, as mentioned, the USB connector 170 includes the SBU2 pin, which may be coupled to OVP FET 162-2 and to the microphone or common second terminals of the right and left speakers 180-R and 180-L if the connection of the speakers to the USB connector 170 is in a second (flipped) orientation.

FIG. 1B illustrates a pin diagram of an example female USB-C connector, which may be used as the USB connector 170 of USB interface circuit 100 in accordance with another aspect of the disclosure. The USB-C connector 170 is a rotationally symmetrical connector. That is, a corresponding male USB-connector, associated with the speakers 180-R and 180-L and microphone (or other USB device), may plug into the female USB-connector 170 in a first orientation or in a second (flipped) orientation, and the signal functionality should not be impacted.

For example, the USB-C connector 170 has a top row of pins labeled, from left to-right, A1 to A12, and are designated as ground return (GND), first transmit differential positive (TX1+), first transmit differential negative (TX1−), bus power (VBUS), first configuration channel (CC1), positive differential data (DP or D+), negative differential data (DP or D−), first sideband use (SBU1), bus power (VBUS), second receive differential negative (RX2−), second receive differential positive (RX2+), and ground return (GND), respectively. Similarly, the USB-C connector 170 has a bottom row of pins labeled, from right-to-left, B1 to B12, and are designated as ground return (GND), second transmit differential positive (TX2+), second transmit differential negative (TX2−), bus power (VBUS), second configuration channel (CC2), positive differential data (DP or D+), negative differential data (DP or D−), second sideband use (SBU2), bus power (VBUS), first receive differential negative (RX1−), first receive differential positive (RX1+), and ground return (GND), respectively. Thus, pins A1-A12 substantially correspond to pins B1 to B12, respectively; with some differences in that some of the pins of A1-A12 are designated with suffixes "1" and "2" (CC1, SBU1, TX1+/TX1−, and RX2+/RX2−), and some of the pins of B1-B12 are also designated with suffixes of "2" and "1" (CC2, SBU2, TX2+/TX2−, and RX1+/RX1−).

Accordingly, with regard to the positive and negative differential data pins DP and DN, the first terminals of the speakers 180-R and 180-L, may contact the DP and DN pins, respectively, regardless of whether the speaker male connector plugs into the USB-C connector 170 in the first or second (flipped) orientation. With regard to SBU1 and SBU2 pins, in the first configuration, the common second terminals of the speakers 180-R and 180-L, may contact the SBU1 (A8) pin, and the associated microphone may contact the SBU2 (B8) pin. In the second (flipped) orientation, the common second terminals of the speakers 180-R and 180-L may contact the SBU2 (B8) pin, and the associated microphone may contact the SBU1 (A8) pin.

The configuration controller 195 may sense the orientation (first or second) by which the speaker connector is plugged into the USB-C connector 170, and may configure the cross-coupling switching device 118 accordingly, as well as the crosstalk sensor 128. For example, if the controller 195 detects the first orientation, the controller 195 configures the cross-coupling switching device 118 to couple the SBU1 pin (speaker common terminals) to ground via the OVP FET 162-1, and the SBU2 pin (microphone) to the microphone audio processing circuit (e.g., inductor $L_M$, resistor $R_M$, microphone bias circuit 124, microphone amplifier 120, and ADC 122) via OVP FET 162-2. If the controller 195 detects the second (flipped) orientation, the controller 195 configures the cross-coupling switching device 118 to couple the SBU2 pin (speaker common terminals) to ground via the OVP FET 162-2, and the SBU1 pin (microphone) to the microphone audio processing circuit (e.g., inductor $L_M$, resistor $R_M$, microphone bias circuit 124, microphone amplifier 120, and ADC 122) via the OVP FET 162-1.

As previously discussed, when the USB interface circuit 100 is configured to transmit analog audio to the speakers 180-R and 180-L, the configuration controller 195 closes the stereo switching devices $SW_R$ and $SW_L$ to send the stereo audio signals $V_{AR}$ and $V_{AL}$ to the right and left speakers 180-R and 180-L via the FETs 160-N and 160-P, respectively. The speaker return signal is sent to ground via the OVP FET 162-1 or 162-2 to which the common terminals of the speakers 180-R and 180-L are connected (e.g., which may be referred to herein as the ground switch). The ground switch 162-1 and 162-2 each has a finite turn-on resistance $R_{ON}$. As discussed further herein, the turn-on resistance $R_{ON}$ produces linear and non-linear crosstalk between the right and left speakers 180-R and 180-L.

For instance, the stereo audio signal currents $I_R$ and $I_L$ through the right and left speakers 180-R and 180-L are summed at the common second terminals, and flows through the ground switch 162-1 or 162-2. Thus, the voltage across the ground FET 162-1 or 162-2 is $(I_L+I_R)*R_{ON}$. The voltages at the first terminals of the right and left speakers 180-R and 180-L are substantially $V_{AR}$ and $V_L$ (assuming no IR losses between the switching devices $SW_R$ and $SW_L$ and the first terminals of the speakers 180-R and 180-L), respectively. Thus, the voltage drops $\Delta V_R$ and $\Delta V_L$ across the right and left speakers 180-R and 180-L are as follows:

$$\Delta V_R = V_{AR} - (I_L+I_R)*R_{ON} \qquad \text{Eq. 1}$$

$$\Delta V_L = V_{AL} - (I_L+I_R)*R_{ON} \qquad \text{Eq. 2}$$

Note that the voltage drops $\Delta V_R$ and $\Delta V_L$ across the right and left speakers 180-R and 180-L have crosstalk components $I_L*R_{ON}$ and $I_R*R_{ON}$, respectively. That is, according to Eq. 1, the voltage drop $\Delta V_R$ across the right speaker 180-R is related to the current $I_L$ flowing through the left speaker 180-L. Similarly, according to Eq. 2, the voltage drop $\Delta V_L$ across the left speaker 180-L, is related to the current IR flowing through the right speaker 180-R, Such crosstalk components $I_L*R_{ON}$ and $I_R*R_{ON}$ affect the accuracy and fidelity of the sound produced by the speakers 180-R and 180-L, and may be removed or reduced to improve the sound accuracy and fidelity.

In this regard, the configuration controller 195, during a calibration procedure, configures the crosstalk sensor 128 to sense the current through the "replica ground" FET 164-1 or 164-2 that is coupled to the common second terminals of the speakers 180-R and 180-L. During the calibration procedure, the FETs 162-1 and 162-2 may be turned off so that the entire return current from the speakers 180-R and 180-L flows to the crosstalk sensor 128. During a first phase of the calibration procedure, the voltage $V_{AL}$ is set to zero (0) Volt (V) and the voltage $V_{AR}$ is set to a known voltage $V_{CAL}$. The crosstalk sensor 128 then measures the sensed current $I_{SNS1}$. Then, during a second phase of the calibration procedure, the voltage $V_{AR}$ is set to 0V and the voltage $V_{AL}$ is set to the known voltage $V_{CAL}$. The crosstalk sensor 128 then measures the sensed current $I_{SNS2}$. The crosstalk sensor 128 may generate the crosstalk sense signal based on the sensed currents $I_{SNS1}$ and $I_{SNS2}$, and provide the crosstalk sense signal to the crosstalk canceller 115.

The crosstalk canceller 115 may calculate the resistances $R_R$ and $R_L$ of the right and left speakers based on the sensed currents $I_{SNS1}$ and $I_{SNS2}$. The crosstalk canceller 115 may then estimate the crosstalk components $I_L*R_{ON}$ and $I_R*R_{ON}$ as being related to $R_L/R_{ON}$ and $R_R/R_{ON}$ or some other formulation (e.g., $R_L/(R_R\|R_{ON})$ and $R_R/(R_L\|R_{ON})$, where $\|$ denotes the parallel resistance). The crosstalk canceller 115 adds the estimated crosstalk components est($I_L*R_{ON}$) and est($I_R*R_{ON}$) to the stereo analog signals $V_R$ and $V_L$ to reduce or substantially eliminate the crosstalk components, respectively. Accordingly, with the crosstalk compensation, the voltages across the speakers 180-R and 180-L may be represented as follows:

$$\Delta V_R = V_{AR} - (I_L+I_R)*R_{ON} + est(I_L*R_{ON}) \approx V_{AR} - I_R*R_{ON} \quad \text{Eq. 3}$$

$$\Delta V_L = V_{AL} - (I_L+I_R)*R_{ON} + est(I_R*R_{ON}) \approx V_A - I_L*R_{ON} \quad \text{Eq. 4}$$

Thus, according to Eqs. 3 and 4, the voltages $\Delta V_R$ and $\Delta V_L$ across the speakers 180-R and 180-L substantially has no crosstalk components due to the crosstalk compensation provided by the crosstalk canceller 115.

There are several disadvantages with the crosstalk cancellation approach in USB interface circuit 100. First, there is a need for the additional FETs 164-1 and 164-2 to provide crosstalk sensing for cancellation purpose. Second, the additional FETs 164-1 and 164-2 need to be wired to the SBU1 and SBU2 pins of the USB connector 170, which may require printed circuit board (PCB) routing and star connections to the USB connector 170. Third, the IC 110 requires additional pins to couple to the crosstalk sensor 128 to the FETs 164-1 and 164-2. Thus, the crosstalk cancellation approach in the USB interface circuit 100 is complicated, increasing wiring, routing, PCB and IC pins complexity, product costs, build of material (BOM) costs, reliability issues, and other adverse issues.

Figure 2:
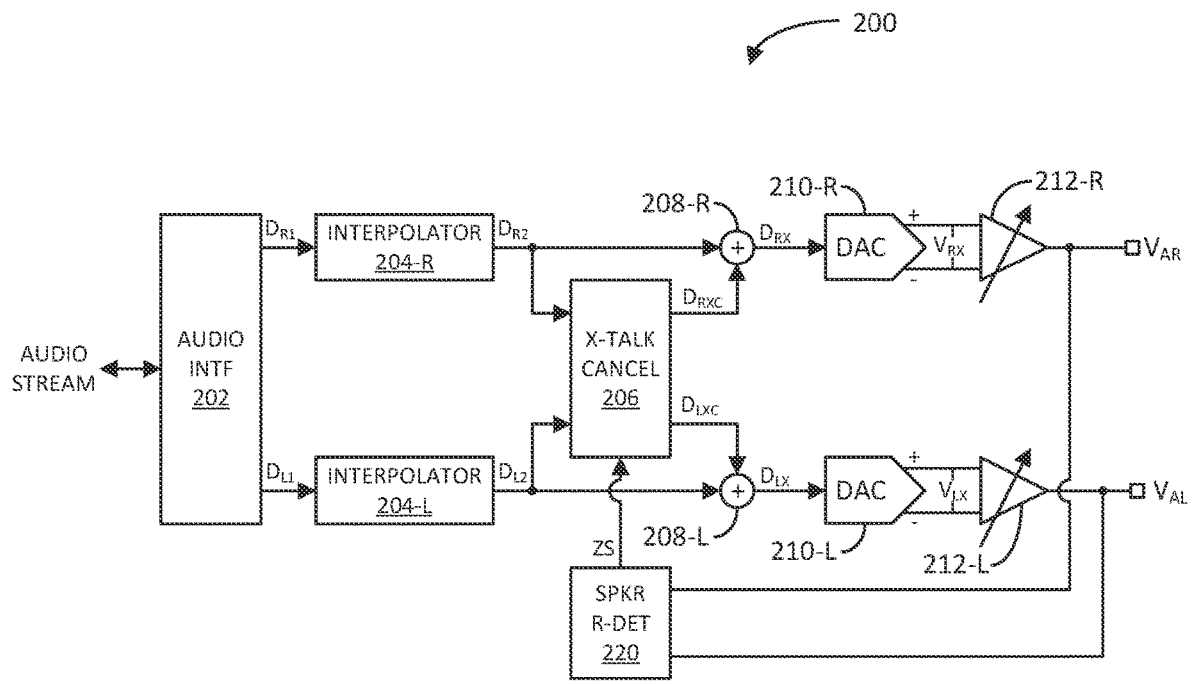
FIG. 2 illustrates a block diagram of an example channel crosstalk cancellation system in accordance with another aspect of the disclosure.

FIG. 2 illustrates a block diagram of an example stereo crosstalk cancellation system 200 in accordance with another aspect of the disclosure. The crosstalk cancellation system 200 may replace the audio interface 112, DACs 114-R and 114-L, crosstalk canceller 115, audio amplifiers 116-R and 116-L, and crosstalk sensor 128 of USB interface circuit 100. Additionally, with the stereo crosstalk cancellation system 200, there is no need for the additional off-chip FETs 164-1 and 164-2 and associated IC pins, PCB wiring, and star connections to the USB connector 170. Thus, any disadvantages using the FETs 164-1 and 164-2 discussed above are eliminated using the crosstalk cancellation system 200.

In particular, the stereo crosstalk cancellation system 200 includes an audio interface (INTF) 202, optional stereo interpolators 204-R and 204-L, channel crosstalk (x-talk) canceller 206, stereo summers 208-R and 208-L, stereo digital-to-analog converters (DACs) 210-R and 210-L, stereo amplifiers 212-R and 212-L (including off-chip inductors, not shown in this figure for the sake of simplicity), and a speaker resistance detector 220.

The audio interface 202 includes an input configured to receive an audio stream from, for example, a processor and/or memory device of a host device (e.g., a wireless communication device, smart phone, tablet device, laptop, desktop, or other device). The audio interface 202 generates stereo digital audio signals $D_{R1}$ and $D_{L1}$ at stereo outputs coupled to inputs of the optional stereo interpolators 204-R and 204-L based on the audio stream, respectively. The stereo interpolators 204-R and 204-L up-samples the stereo digital audio signals $D_{R1}$ and $D_{L1}$ to generate up-sampled stereo digital audio signals $D_{R2}$ and $D_{L2}$ at outputs coupled to stereo inputs of the crosstalk canceller 206, and inputs of stereo summers 208-R and 208-L, respectively. As mentioned, the interpolators 204-R and 204-L are optional, and the stereo outputs of the audio interface 202 may be coupled directly to the stereo inputs of the crosstalk canceller 206 and inputs of stereo summers 208-R and 208-L, respectively.

As discussed in more detail herein, the crosstalk canceller 206 generates stereo crosstalk-cancelling signals $D_{RXC}$ and $D_{LXC}$ based on the stereo digital audio signals $D_{R2}$ and $D_{L2}$ (or $D_{R1}$ and $D_{L1}$) and a speaker resistance signal $Z_S$ generated by the speaker resistance detector 220. The speaker resistance signal ZS provides a measurement of the resistance $R_R$ of the right speaker 180-R and the resistance $R_L$ of the left speaker 180-L. Note that the turn-on resistance $R_{ON}$ of the ground switch 162-1 or 162-2 may vary from manufacturer-to-manufacturer and from lot-to-lot, and the headphone speaker resistances $R_R$ and $R_L$ may also vary depending on the model or type of headphones connected to the USB connector 170.

The crosstalk-cancelling signals $D_{RXC}$ and $D_{LXC}$ may correspond to a digital version of the estimate crosstalk compensation components est($I_L*R_{ON}$) and est($I_R*R_{ON}$) previously discussed with reference to Eqs. 1-2. However, the turn-on resistance $R_{ON}$ of the ground switch 162-1 or 162-2 may vary non-linearly with the current $I_R+I_L$ flowing through the ground switch 162-1 or 162-2. Thus, as discussed in more detail further herein, the crosstalk compensation signals $D_{RXC}$ and $D_{LXC}$ each includes a linear component and a non-linear component to compensate for the linear and non-linear variations of the turn-on resistance $R_{ON}$ of the ground switch 162-1 or 162-2.

The stereo summers 208-R and 208-L sum the stereo digital audio signals $D_{R2}$ and $D_{L2}$ with the crosstalk-cancelling signals $D_{RXC}$ and $D_{LXC}$ to generate crosstalk-compensated stereo digital audio signals $D_{RX}$ and $D_{LX}$ at outputs coupled to inputs of the stereo DACs 210-R and 210-L, respectively. The stereo DACs 210-R and 210-L convert the crosstalk-compensated stereo digital audio signals $D_{RX}$ and $D_{LX}$ into differential crosstalk-compensated analog audio signals $V_{RX}$ and $V_{LX}$ at differential outputs coupled to differential inputs of the audio amplifiers 212-R and 212-L, respectively. The audio amplifiers 212-R and 212-L, which may have variable or programmable gains, amplify the differential crosstalk-compensated analog audio signals $V_{RX}$ and $V_{LX}$ to generate stereo amplified audio signals $V_{AR}$ and $V_{AL}$, which may be provided to the speakers 180-R and 180-L via the stereo switching devices $SW_R$ and $SW_L$, respectively.

The speaker resistance detector 220 includes inputs coupled to the outputs of the stereo audio amplifiers 212-R and 212-L to receive the stereo amplified audio signals $V_{AR}$ and $V_{AL}$, respectively. The speaker resistance detector 220 is able to determine the resistances $R_R$ and $R_L$ of the right and left speakers 180-R and 180-L based on a known calibrated voltage $V_{CAL}$ for either $V_{AR}$ or $V_{AL}$ pursuant to a calibration procedure. For example, with the amplifiers 212-R and 212-L decoupled from the inputs of the speaker resistance detector 220, the voltage $V_{AR}$ may be set to the calibrated voltage $V_{CAL}$ with the ground switch 162-1 or 162-2 turned on, and the speaker resistance detector 220 may measure a first sense current $I_{SNS1}$ received via the $V_{AL}$ terminal pursuant to a first phase of the calibration procedure. Pursuant to the first calibration phase, the speaker resistance detector 220 may derive the following equation:

$$I_{SNS1} = V_{CAL}/(R_R + R_L \| R_{ON}) \quad \text{Eq. 5}$$

Pursuant to a second calibration phase, the voltage $V_{AR}$ may be set to the calibrated voltage $V_{CAL}$ with the ground switch 162-1 or 162-2 now turned off, and the speaker resistance detector 220 may then measure a second sense current $I_{SNS2}$, received via the $V_{AL}$ terminal. The speaker resistance detector 220 may derive the following equation:

$$I_{SNS2} = V_{CAL}/(R_R + R_L) \quad \text{Eq. 6}$$

Pursuant to a first calibration option, the resistances $R_R$ and $R_L$ of the right- and left-speakers are assumed to be the same. As $V_{CAL}$ is known, the speaker resistance detector 220 may solve for $R_R/R_L$ and $R_{ON}$ using two equations-two unknowns algebraic processing. Accordingly, the speaker resistance detector 220 generates the impedance signal ZS to include $R_R$, $R_L$, and $R_{ON}$.

Pursuant to a second calibration option, the resistances $R_R$ and $R_L$ of e right- and left-speakers are assumed not to be the same. In this regard, an additional third phase of the calibration is performed with the voltage $V_{AL}$ set to the calibrated voltage $V_{CAL}$ and the ground switch 162-1 or 162-2 turned on, and the speaker resistance detector 220 may measure a third sense current $I_{SNS3}$ received via the $V_{AR}$ terminal pursuant to a third phase of the calibration procedure. The speaker resistance detector 220 may derive the following equation:

$$I_{SNS3} = V_{CAL}/(R_L + R_R \| R_{ON}) \quad \text{Eq. 7}$$

Figure 3:
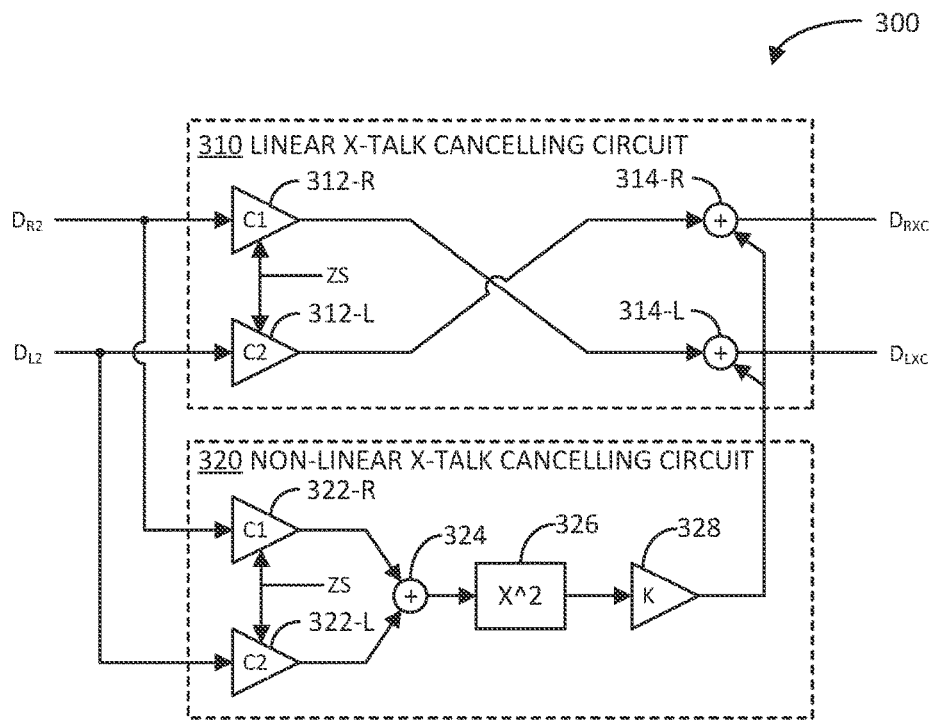
FIG. 3 illustrates a block diagram of an example channel crosstalk canceller in accordance with another aspect of the disclosure.

As $V_{CAL}$ is known, the speaker resistance detector 220 may solve for $R_R$, $R_L$ and $R_{ON}$ using three equations-three unknowns algebraic processing. Similarly, the speaker resistance detector 220 generates the impedance signal ZS to include $R_R$, $R_L$, and $R_{ON}$ FIG. 3 illustrates a block diagram of an example stereo crosstalk canceller 300 in accordance with another aspect of the disclosure. The stereo crosstalk canceller 300 may be an example more detailed implementation of the crosstalk canceller 206 of stereo crosstalk cancellation system 200.

In particular, the crosstalk canceller 300 includes a linear crosstalk cancelling circuit 310 and a non-linear crosstalk cancelling circuit 320. The linear crosstalk cancelling circuit 310 includes a first coefficient C1 multiplier 312-R, second coefficient C2 multiplier 312-L, first summer 314-R, and second summer 314-L. The first multiplication coefficient C1 may be related to $R_L/R_{ON}$, $R_R \| R_{ON}$), or some other formulation, as these values have been provided to the crosstalk canceller 300 by the speaker resistance detector 220. Similarly, the second multiplication coefficient C2 may be related to $R_R/R_{ON}$, or $R_R/(R_L \| R_{ON})$, or some other formulation. The C1 and C2 multipliers 312-R and 312-L include inputs coupled to the outputs of the interpolators 204-R and 204-L to receive the stereo digital audio signals $D_{R2}$ and $D_{L2}$, respectively. Thus, the C1 and C2 multipliers 312-R and 312-L are configured to generate linear crosstalk cancelling signals $C1*D_{R2}$ and $C2*D_{L2}$ at outputs coupled to first inputs of summers 314-R and 314-L, respectively.

The non-linear crosstalk cancelling circuit 320 similarly includes first coefficient C1 multiplier 322-R, second coefficient C2 multiplier 322-L, summer 324, non-linear computation block (e.g., squarer) 326, and third coefficient K multiplier 328. The first and second coefficient C1 and C2 multipliers 322-R and 322-L also include inputs coupled to the outputs of the interpolators 204-R and 204-L to receive the stereo digital audio signals $D_{R2}$ and $D_{L2}$, respectively. Thus, the C1 and C2 multipliers 322-R and 322-L are configured to generate first set of intermediate signals $C1*D_{R2}$ and $C2*D_{L2}$ at outputs coupled to inputs of summer 324, respectively. It shall be understood that since the multipliers 322-R and 322-L perform substantially the same function as multipliers 312-R and 312-L, the crosstalk canceller 300 may optionally employ one pair of them to implemented both operations.

The summer 324 adds the first set of intermediate signals to generate the summed second intermediate signal $C1*D_{R2} + C2*D_{L2}$ at an output coupled to an input of the non-linear computation block 326, The non-linear computation block 326, which may be a squarer, generates a third intermediate signal $(C1*D_{R2} + C2*D_{L2})^2$ at an output coupled to an input of the third coefficient K multiplier 328. Although the non-linear computation block 326 is exemplified as a squarer, it shall be understood that the non-linear computation block 326 may additionally perform higher order non-linearization computation. The third multiplication coefficient K multiplier 328 multiplies the third intermediate signal $(C1*D_{R2} + C2*D_{L2})^2$ by the third coefficient K to generate a non-linear crosstalk cancelling signal $K*(C1*D_{R2} + C2*D_{L2})^2$ at an output of the non-linear crosstalk cancelling circuit 320. The third coefficient K may be empirically determined based on the non-linear characteristic of the turn-on resistance $R_{ON}$ of ground switch 162-1 or 162-2.

The output of the third coefficient multiplier 328 is coupled to second inputs of the first and second summers 314-R and 314-L of the linear crosstalk cancelling circuit 310. The first and second summers 314-R and 314-L sum the linear crosstalk cancelling signals $C2*D_{L2}$ and $C1*D_{R2}$ with the non-linear crosstalk cancelling signal $K*(C1*D_{R2} + C2*D_{L2})^2$ to generate the crosstalk-cancelling stereo signals $D_{RXC}$ and $D_{LXC}$ at outputs coupled to second inputs of the stereo summers 208-R and 208-L, respectively.

Figure 4:
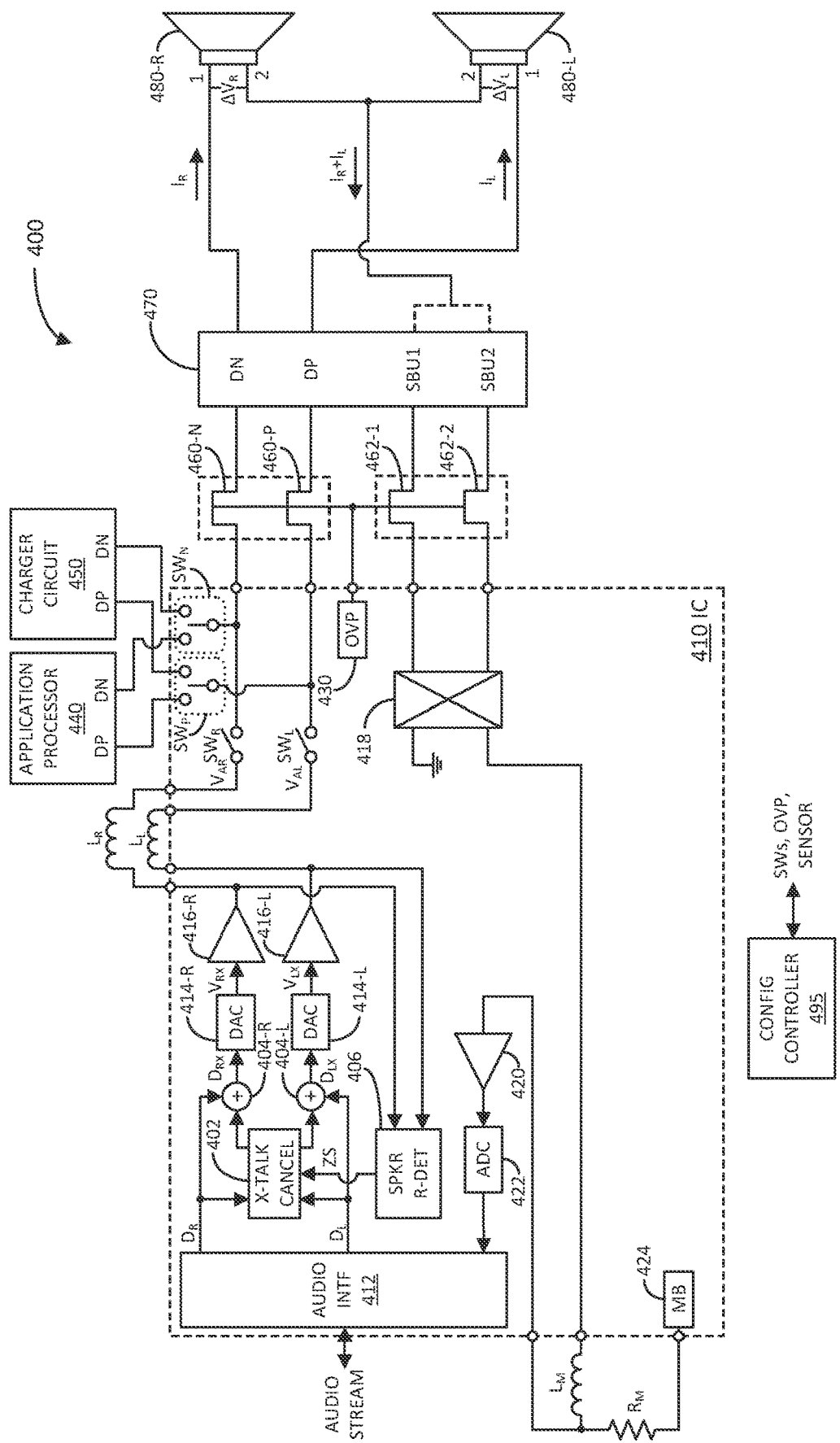
FIG. 4 illustrates a block/schematic diagram of another example Universal Serial Bus (USB) interface circuit in accordance with another aspect of the disclosure.

FIG. 4 illustrates a block/schematic diagram of another example Universal Serial Bus (USB) interface circuit 400 in accordance with another aspect of the disclosure. The USB interface circuit 400 is based on USB interface circuit 100, including an integrated circuit (IC) 410 having an audio interface 412, right- and left-channel audio amplifiers 416-R and 416-L including off-chip inductors $L_R$ and $L_L$, stereo switching devices $SW_R$ and $SW_L$, SPDT switching devices $SW_P$ and $SW_N$, overvoltage protection (OVP) circuit 430, cross-coupling switching device 418, and microphone processing circuitry including microphone bias (MB) circuit 424 coupled to off-chip resistor $R_M$, audio amplifier 420 coupled to off-chip inductor $L_M$ and resistor $R_M$, and analog-to-digital converter (ADC) 422. Similarly, the USB interface circuit 400 includes an application processor 440, a charger circuit 450, a configuration controller 495, overvoltage protection (OVP) switches 460-N, 460-P, 462-1, and 462-2 (e.g., FETs), and USB connector 470, which may be connected to headphone speakers 480-R and 480-L. These aforementioned elements including their connections and operations have been discussed in detail with respect to USB interface circuit 100.

The USB interface circuit 400 differs from USB interface circuit 100 in that it includes a crosstalk canceller 402, summers 404-R and 404-L, and speaker resistance detector 406. The crosstalk canceller 402 may correspond to crosstalk canceller 206 or 300 previously discussed in detail. The summers 404-R and 404-L may correspond to summers 208-R and 208-L, and the speaker resistance detector 406 may correspond to speaker resistance detector 220 previously discussed in detail.

More specifically, the crosstalk canceller 402 includes stereo inputs coupled to stereo outputs of the audio interface 412 to receive stereo digital audio signals $D_R$ and $D_L$, respectively. As previously mentioned, the interpolators 204-R and 204-L are optional, so they are not shown in FIG. 4; however, it shall be understood that the USB interface circuit 400 may include such interpolators. The crosstalk canceller 402 is configured to generate right- and left-crosstalk-compensating signals, which are summed with stereo digital audio signals $D_R$ and $D_L$ by summers 404-R and 404-L to generate stereo crosstalk-compensated digital signals $D_{RX}$ and Dix, respectively. The USB interface circuit 400 further includes stereo DACs 414-R and 414-L coupled to outputs of the summers 404-R and 404-L to receive the stereo crosstalk-compensated digital signals $D_{RX}$ and $D_{LX}$ and generate stereo crosstalk-compensated analog signals $V_{RX}$ and $V_{LX}$ therefrom, respectively.

The stereo audio amplifiers 416-R and 416-L include inputs coupled to outputs of the stereo DACs 414-R and 414-L to receive and amplify the stereo crosstalk-compensated analog signals $V_{RX}$ and $V_{LX}$ to generate amplified stereo crosstalk-compensated analog signals $V_{AR}$ and $V_{AL}$, which may be provided to the headphone speakers 480-R and 480-L via the stereo switching devices $SW_R$ and $SW_L$, OVP switches 460-N and 460-P, and pins DN and DP of USB connector 470, respectively.

The speaker resistance detector 406 includes inputs coupled to the outputs of the stereo audio amplifiers 416-R and 416-L, respectively. As previously discussed, the speaker resistance detector 406 may perform a first calibration option to determine the assumed-to-be-equal resistance of the right- and left-speakers 480-R and 480-L and the resistance of the ground switch 462-1 or 462-2 using equations 5-6. Or, the speaker resistance detector 406 may perform a second calibration option to determine the resistances of the right- and left-speakers 480-R and 480-L and the resistance of the ground switch 462-1 or 462-2 using equations 5-7. The speaker resistance detector 406 generates a speaker resistance signal ZS with the speakers and ground switch resistances information, and provides it to the crosstalk canceller 402, which determines the coefficients C1 and C2 based on the speaker resistance signal ZS, as previously discussed.

Note that the replica overvoltage (OVP) switches 164-1 and 164-2, their connections to the SBU1 and SBU2 pins of USB connector 170, and their connections to pins of the IC 110 have been eliminated in USB interface circuit 400. This reduces and/or eliminates the wiring, routing, PCB and IC pins complexity, product costs, build of material (BOM) costs, reliability issues, and other adverse issues.

Figure 5:
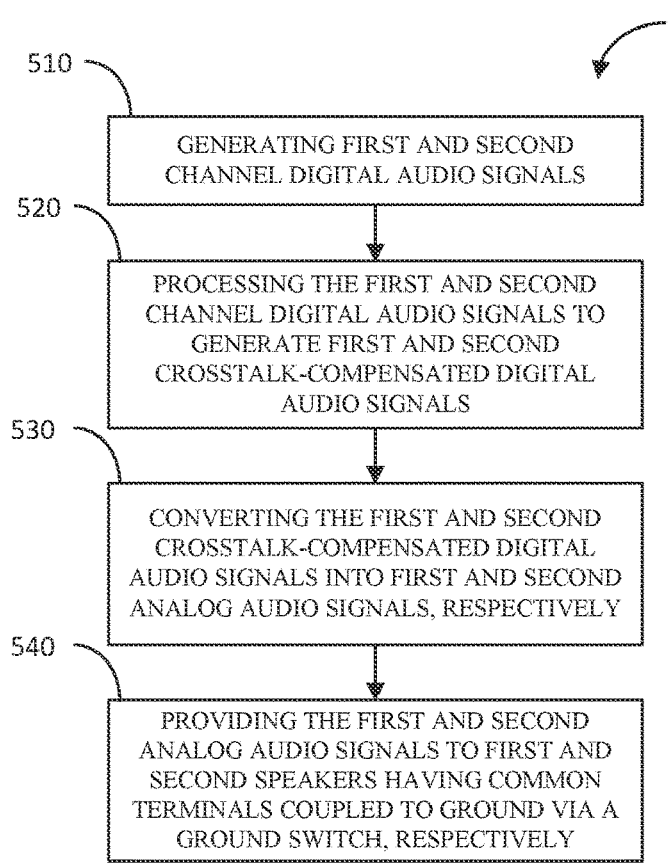
FIG. 5 illustrates a flow diagram of an example method of reducing channel crosstalk due to a common ground switch in accordance with another aspect of the disclosure.

FIG. 5 illustrates a flow diagram of an example method 500 of reducing stereo crosstalk due to a common ground switch in accordance with another aspect of the disclosure. The method 500 includes generating first and second channel digital audio signals (block 510). Examples of means for generating first and second channel digital audio signals include the audio interface 112, audio interface 202, audio interface 412, and interpolators 204-R and 204-L.

The method 500 further includes processing the first and second channel digital audio signals to generate first and second crosstalk-compensated digital audio signals (block 520). Examples of means for processing the first and second channel digital audio signals to generate first and second crosstalk-compensated digital audio signals include crosstalk canceller 206, crosstalk canceller 300, any one of the linear or non-linear crosstalk cancelling circuit 310 or 320, or crosstalk canceller 402.

Additionally, the method 500 includes converting the first and second crosstalk-compensated digital audio signals into first and second analog audio signals, respectively (block 530). Examples of means for converting the first and second crosstalk-compensated digital audio signals into first and second analog audio signals include DACs 210-R and 210-L, and 414-R and 414-L, respectively.

Further, the method 500 includes providing the first and second analog audio signals to first and second speakers having common terminals coupled to ground via a ground switch, respectively (block 540). Examples of means for providing the first and second analog audio signals to first and second speakers having common terminals coupled to ground via a ground switch, respectively, include the USB connectors 170, 470, and 550.

The processing of the first and second channel digital audio signals pursuant to block 520 may include multiplying the first channel digital audio signal by a first coefficient to generate a first intermediate digital signal; and multiplying the second channel digital audio signal by a second coefficient to generate a second intermediate digital signal. Examples of means for multiplying the first channel digital audio signal by a first coefficient to generate a first intermediate digital signal include the multipliers 312-R and 322-R. Examples of means for multiplying the second channel digital audio signal by a second coefficient to generate a second intermediate digital signal include the multipliers 312-L and 322-L.

The processing of the first and second channel digital audio signals pursuant to block 520 may further include summing the first and second intermediate digital signals to generate a third intermediate signal; squaring the third intermediate digital signal to generate a fourth intermediate digital signal; and multiplying the fourth intermediate digital signal by a third coefficient to generate a fifth intermediate digital signal. An example of means for summing the first and second intermediate digital signals to generate a third intermediate signal include the summer 324. An example of means for squaring the third intermediate digital signal to generate a fourth intermediate digital signal include the non-linear computation block 326. An example of means for multiplying the fourth intermediate digital signal by a third coefficient to generate a fifth intermediate digital signal include the multiplier 328.

The processing of the first and second channel digital audio signals pursuant to block 520 may further include summing the second intermediate signal with the fifth intermediate signal to generate a first crosstalk-cancelling digital signal; summing the first intermediate signal with the fifth intermediate signal to generate a second crosstalk-cancelling digital signal; summing the first crosstalk-cancelling digital signal with the first channel digital audio signal to generate the first crosstalk-compensated digital audio signal; and summing the second crosstalk-cancelling digital signal with the second channel digital audio signal to generate the second crosstalk-compensated digital audio signal.

An example means for summing the second intermediate signal with the fifth intermediate signal to generate a first crosstalk-cancelling digital signal includes summer 314-R. An example of means for summing the first intermediate signal with the fifth intermediate signal to generate a second crosstalk-cancelling digital signal includes summer 314-L. An example of means for summing the first crosstalk-cancelling digital signal with the first channel digital audio signal to generate the first crosstalk-compensated digital audio signal includes the summer 208-R. And, an example of means for summing the second crosstalk-cancelling digital signal with the second channel digital audio signal to generate the second crosstalk-compensated digital audio signal includes the summer 208-L.

Figure 6:
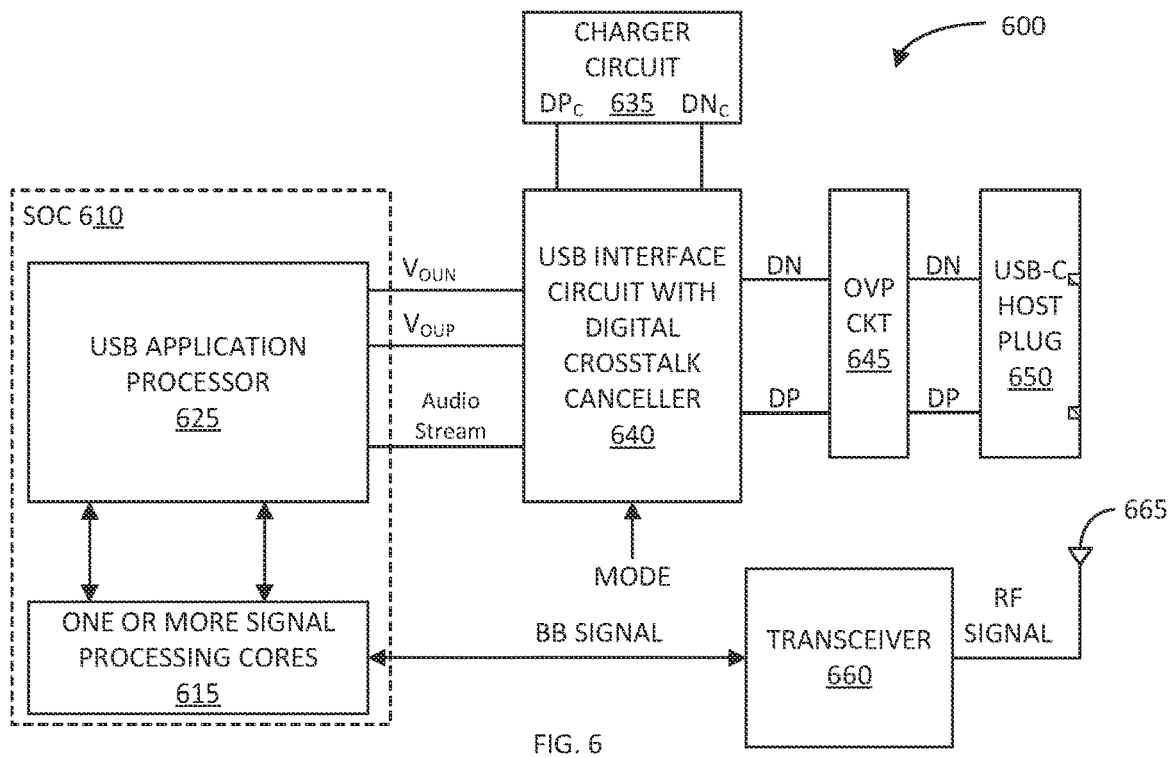
FIG. 6 illustrates a block diagram of an example wireless communication device in accordance with another aspect of the disclosure.

FIG. 6 illustrates a block diagram of an example wireless communication device 600 in accordance with another aspect of the disclosure. The wireless communication device 600 may be implemented as any type of wireless communication device, such as mobile handset device, tablet device, laptop computer, desktop computer, wearable device (e.g., a smart watch, health monitoring device, human activity monitoring device, etc.), Internet of Things (IoT) device, etc.

The wireless communication device 600 includes an integrated circuit (IC) 610, which may be implemented as a system on chip (SOC). The SOC 610 may include one or more signal processing cores 615 coupled to a USB application processor 625. The one or more signal processing cores 615 may be configured to generate and/or process a baseband (BB) signal. The USB application processor 625 may be configured to generate an audio stream based on audio data received from the one or more signal processing cores 615. The USB application processor 625 may also be configured to generate a USB differential data signal $V_{OUN}/V_{OUP}$ based on data received from the one or more signal processing cores 615, and/or process the USB differential data signal $V_{OUN}/V_{OUP}$ received from a client device connected to a USB-C host connector 650.

The wireless communication device 600 further includes a USB interface circuit 640 (with integrated digital crosstalk canceller), which may be implemented per IC 410, as previously discussed. The USB interface circuit 640 is coupled to the USB application processor 625 to receive and/or provide an audio stream therefrom and/or thereto. The USB interface circuit 640 is also differentially coupled to the USB application processor 625 to receive and/or provide the USB differential data signal $V_{OUN}/V_{OUP}$ therefrom and/or thereto. The USB interface circuit 640 may be coupled to a charger circuit 635 to receive and/or provide charger data signal therefrom and/or thereto. The USB interface circuit 640 includes at least a portion of the USB differential transmission lines DP/DN, which is coupled to an overvoltage protection (OVP) circuit 645, and DN and DN pins of a USB-C connector 650. The OVP circuit 645 may include the ground switch or FET previously discussed, which may produce crosstalk distortion between the right and left stereo audio channel signals.

A client device may be plugged into the USB-C connector 650. If a mode signal indicates USB data communication, the USB interface circuit 640 may route the USB differential data signal $V_{OUN}/V_{OUP}$ to the client device or the USB application processor 625. If the mode signal indicates stereo audio transmission, the USB interface circuit 640 may route the stereo analog audio signals $V_{AR}$ and $V_{AL}$ to the client device via the USB differential data transmission lines DN/DP, OVP circuit 645, and the USB-C connector 650. And, if the mode signal indicates charger data communication, the USB interface circuit 640 may route the charger data signals to the client device or charger circuit 635.

For wireless transmissions, the wireless communication device 600 includes a transceiver 660 coupled to the one or more signal processing cores 615 to provide and/or receive a baseband (BB) signal to and/or from the one or more signal processing cores 615. The wireless communication device 600 also includes at least one antenna 665 (e.g., an antenna array) to provide and/or receive a radio frequency (RF) signal to and/or from the transceiver 660. In accordance with a transmission application, the transceiver 660 is configured to process a transmit BB signal to generate a transmit RF signal for wireless transmission to a remote device via the at least one antenna 665. In accordance with a receive application, the transceiver 660 is configured to process an RF signal received from the at least one antenna 665 to generate a received BB signal for signal processing by the one or more signal processing cores 615.

The following provides an overview of aspects of the present disclosure:

Aspect 1: An apparatus, including an audio interface including first and second outputs; a crosstalk cancelling circuit including first and second inputs coupled to the first and second outputs of the audio interface, respectively; a first summer including a first input coupled to the first output of the audio interface and a second input coupled to a first output of the crosstalk cancelling circuit; a second summer including a first input coupled to the second output of the audio interface and a second input coupled to a second output of the crosstalk cancelling circuit; a first digital to analog converter (DAC) including an input coupled to an output of the first summer; and a second DAC including an input coupled to an output of the second summer.

Aspect 2: The apparatus of aspect 1, wherein the crosstalk cancelling circuit includes a linear crosstalk cancelling circuit.

Aspect 3: The apparatus of aspect 2, wherein the linear crosstalk cancelling circuit includes: a first multiplier including a first input coupled to the first output of the audio interface; and a second multiplier including a second input coupled to the second output of the audio interface.

Aspect 4: The apparatus of aspect 3, wherein: the first multiplier has a first multiplication coefficient related to a first resistance across a first speaker; and the second multiplier has a second multiplication coefficient related to a second resistance across a second speaker.

Aspect 5: The apparatus of aspect 4, wherein: the first multiplication coefficient is related to the first resistance divided by a turn-on resistance of a ground switch; and the second multiplication coefficient is related to the second resistance divided by the turn-on resistance of the ground switch.

Aspect 6: The apparatus of aspect 4, wherein: the first multiplication coefficient is related to the first resistance divided by a first parallel resistance of a turn-on resistance of a ground switch and the second resistance; and the second multiplication coefficient is related to the second resistance divided by a second parallel resistance of the turn-on resistance of the ground switch and the first resistance.

Aspect 7: The apparatus of any one of aspects 1-6, wherein the crosstalk cancelling circuit comprises a non-linear crosstalk cancelling circuit.

Aspect 8: The apparatus of aspect 7, wherein the non-linear crosstalk cancelling circuit comprises: a third multiplier including a third input coupled to the first output of the audio interface; a fourth multiplier including a fourth input coupled to the second output of the audio interface; a third summer including inputs coupled to third and fourth outputs of the third and fourth multipliers, respectively; a non-linear computation block including an input coupled to an output of the third summer; and a fifth multiplier including an input coupled to an output of the non-linear computation block.

Aspect 9: The apparatus of aspect 8, wherein the non-linear computation block comprises a squarer.

Aspect 10: The apparatus of aspect 8 or 9, wherein the fifth multiplier includes a multiplication coefficient related to a non-linear characteristic of a turn-on resistance of a ground switch.

Aspect 11: The apparatus of any one of aspects 8-10, wherein the linear crosstalk cancelling circuit further includes: a fourth summer including inputs coupled to outputs of the second and fifth multipliers, respectively, and an output coupled to the second input of the first summer; and a fifth summer including inputs coupled to outputs of the first and fifth multipliers, respectively, and an output coupled to the second input of the second summer.

Aspect 12: The apparatus of any one of aspects 1-6, wherein the crosstalk cancelling circuit comprises a non-linear crosstalk cancelling circuit.

Aspect 13: The apparatus of aspect 12, wherein the non-linear crosstalk cancelling circuit comprises: a first multiplier including an input coupled to the first output of the audio interface; a second multiplier including an input coupled to the second output of the audio interface; a third summer including inputs coupled to outputs of the first and second multipliers, respectively; a non-linear computation block including an input coupled to an output of the third summer; and a third multiplier including an input coupled to an output of the non-linear computation block.

Aspect 14: The apparatus of any one of aspects 1-13, further comprising: a first audio amplifier including an input coupled to an output of the first DAC; and a second audio amplifier including an input coupled to an output of the second DAC.

Aspect 15: The apparatus of aspect 14, further comprising a speaker resistance detector including first and second inputs coupled to first and second outputs of the first and second audio amplifiers, respectively, and an output coupled to the crosstalk cancelling circuit.

Aspect 16: The apparatus of aspect 14 or 15, further comprising a Universal Serial Bus (USB) connector including: a first pin selectively coupled to a first output of the first audio amplifier, wherein the first pin is configured to couple to a first terminal of a first speaker; a second pin selectively coupled to a second output of the second audio amplifier, wherein the second pin is configured to couple to a first terminal of a second speaker; and a third pin coupled to a ground switch, wherein the third pin is configured to couple to common second terminals of the first and second speakers.

Aspect 17: A method, comprising: generating first and second channel digital audio signals; processing the first and second channel digital audio signals to generate first and second crosstalk-compensated digital audio signals; converting the first and second crosstalk-compensated digital audio signals into first and second analog audio signals, respectively; and providing the first and second analog audio signals to first and second speakers having common terminals coupled to ground via, a ground switch, respectively.

Aspect 18: The method of aspect 17, wherein processing the first and second channel digital audio signals comprises: multiplying the first channel digital audio signal by a first coefficient to generate a first intermediate digital signal; and multiplying the second channel digital audio signal by a second coefficient to generate a second intermediate digital signal.

Aspect 19: The method of aspect 18, wherein: the first coefficient is related to a first resistance across the second speaker; and the second coefficient is related to a second resistance across the first speaker.

Aspect 20: The method of aspect 18 or 19, wherein processing the first and second channel digital audio signals further comprises: summing the first and second intermediate digital signals to generate a third intermediate signal; squaring the third intermediate digital signal to generate a fourth intermediate digital signal; and multiplying the fourth intermediate digital signal by a third coefficient to generate a fifth intermediate digital signal.

Aspect 21: The method of aspect 20, wherein the third coefficient is related to a non-linear resistance of the ground switch.

Aspect 22: The method of aspect 20 or 21, wherein processing the first and second channel digital audio signals further comprises: summing the second intermediate signal with the fifth intermediate signal to generate a first crosstalk-cancelling digital signal; summing the first intermediate signal with the fifth intermediate signal to generate a second crosstalk-cancelling digital signal; summing the first crosstalk-cancelling digital signal with the first channel digital audio signal to generate the first crosstalk-compensated digital audio signal; and summing the second crosstalk-cancelling digital signal with the second channel digital audio signal to generate the second crosstalk-compensated digital audio signal.

Aspect 23: An apparatus, comprising: means for generating first and second channel digital audio signals; means for processing the first and second channel digital audio signals to generate first and second crosstalk-compensated digital audio signals; means for converting the first and second crosstalk-compensated digital audio signals into first and second analog audio signals, respectively; and means for providing the first and second analog audio signals to first and second speakers having common terminals coupled to ground via a ground switch, respectively.

Aspect 24: The apparatus of aspect 23, wherein the means for processing the first and second channel digital audio signals, comprises: means for multiplying the first channel digital audio signal by a first coefficient to generate a first intermediate digital signal; and means for multiplying the second channel digital audio signal by a second coefficient to generate a second intermediate digital signal.

Aspect 25: The apparatus of aspect 24, wherein: the first coefficient is related to a first resistance across the second speaker; and the second coefficient is related to a second resistance across the first speaker.

Aspect 26: The apparatus of aspect 24 or 25, wherein the means for processing the first and second channel digital audio signals further comprises: means for summing the first and second intermediate digital signals to generate a third intermediate signal; means for squaring the third intermediate digital signal to generate a fourth intermediate digital signal; and means for multiplying the fourth intermediate digital signal by a third coefficient to generate a fifth intermediate digital signal.

Aspect 27: The apparatus of aspect 26, wherein the third coefficient is related to a non-linear resistance of the ground switch.

Aspect 28: The apparatus of aspect 26 or 27, wherein the means for processing the first and second channel digital audio signals further comprises: means for summing the first intermediate signal with the fifth intermediate signal to generate a first crosstalk-cancelling digital signal; means for summing the second intermediate signal with the fifth intermediate signal to generate a second crosstalk-cancelling digital signal; means for summing the second crosstalk-cancelling digital signal with the first channel digital audio signal to generate the first crosstalk-compensated digital audio signal; and means for summing the first crosstalk-cancelling digital signal with the second channel digital audio signal to generate the second crosstalk-compensated digital audio signal.

Aspect 29: A wireless communication device, comprising: at least one antenna; a transceiver coupled to the at least one antenna; one or more signal processing cores coupled to the transceiver; an audio interface including first and second outputs, wherein the audio interface is coupled to the one or more signal processing cores; a crosstalk cancelling circuit including first and second inputs coupled to the first and second outputs of the audio interface, respectively; a first summer including a first input coupled to the first output of the audio interface and a first output of the crosstalk cancelling circuit; a second summer including a second input coupled to the second output of the audio interface and a second output of the crosstalk cancelling circuit; a first digital to analog converter (DAC) including an input coupled to an output of the first summer; and a second DAC including an input coupled to an output of the second summer.

Aspect 30: The wireless communication device of aspect 29, further comprising: a first audio amplifier including an input coupled to an output of the first DAC; a second audio amplifier including an input coupled to an output of the second DAC; a Universal Serial Bus (USB) application processor; a charger circuit; and a USB connector selectively coupled to the first and second audio amplifiers, the USB application processor, and the charger circuit.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising:
   an audio interface including first and second outputs;
   a non-linear crosstalk cancelling circuit including first and second inputs coupled to the first and second outputs of the audio interface, respectively, wherein the non-linear crosstalk cancelling circuit comprises:
   a first multiplier including a first input coupled to the first output of the audio interface; and
   a second multiplier including a second input coupled to the second output of the audio interface;
   a third multiplier including a third input coupled to the first output of the audio interface;
   a fourth multiplier including a fourth input coupled to the second output of the audio interface;
   a third summer including inputs coupled to third and fourth outputs of the third and fourth multipliers, respectively;
   a non-linear computation block including an input coupled to an output of the third summer; and
   a fifth multiplier including an input coupled to an output of the non-linear computation block;
   a first summer including a first input coupled to the first output of the audio interface and a second input coupled to a first output of the crosstalk cancelling circuit;
   a second summer including a first input coupled to the second output of the audio interface and a second input coupled to a second output of the crosstalk cancelling circuit;
   a first digital to analog converter (DAC) including an input coupled to an output of the first summer; and
   a second DAC including an input coupled to an output of the second summer.

2. The apparatus of claim 1, wherein:
   the first multiplier has a first multiplication coefficient related to a first resistance across a first speaker; and
   the second multiplier has a second multiplication coefficient related to a second resistance across a second speaker.

3. The apparatus of claim 2, wherein:
   the first multiplication coefficient is related to the first resistance divided by a turn-on resistance of a ground switch; and
   the second multiplication coefficient is related to the second resistance divided by the turn-on resistance of the ground switch.

4. The apparatus of claim 2, wherein:
   the first multiplication coefficient is related to the first resistance divided by a first parallel resistance of a turn-on resistance of a ground switch and the second resistance; and
   the second multiplication coefficient is related to the second resistance divided by a second parallel resistance of the turn-on resistance of the ground switch and the first resistance.

5. The apparatus of claim 1, wherein the non-linear computation block comprises a squarer.

6. The apparatus of claim 1, wherein the fifth multiplier includes a multiplication coefficient related to a non-linear characteristic of a turn-on resistance of a ground switch.

7. The apparatus of claim 1, wherein the linear crosstalk cancelling circuit further includes:
   a fourth summer including inputs coupled to outputs of the second and fifth multipliers, respectively, and an output coupled to the second input of the first summer; and
   a fifth summer including inputs coupled to outputs of the first and fifth multipliers, respectively, and an output coupled to the second input of the second summer.

8. The apparatus of claim 1, further comprising:
   a first audio amplifier including an input coupled to an output of the first DAC; and
   a second audio amplifier including an input coupled to an output of the second DAC.

9. The apparatus of claim 8, further comprising a speaker resistance detector including first and second inputs coupled to first and second outputs of the first and second audio amplifiers, respectively, and an output coupled to the crosstalk cancelling circuit.

10. The apparatus of claim 8, further comprising a Universal Serial Bus (USB) connector including:
a first pin selectively coupled to a first output of the first audio amplifier, wherein the first pin is configured to couple to a first terminal of a first speaker;
a second pin selectively coupled to a second output of the second audio amplifier, wherein the second pin is configured to couple to a first terminal of a second speaker; and
a third pin coupled to a ground switch, wherein the third pin is configured to couple to common second terminals of the first and second speakers.

11. An apparatus comprising:
an audio interface including first and second outputs;
a non-linear crosstalk cancelling circuit including first and second inputs coupled to the first and second outputs of the audio interface, respectively, wherein the non-linear crosstalk cancelling circuit comprises:
a first multiplier including an input coupled to the first output of the audio interface;
a second multiplier including an input coupled to the second output of the audio interface;
a first summer including inputs coupled to outputs of the first and second multipliers, respectively;
a non-linear computation block including an input coupled to an output of the first summer; and
a third multiplier including an input coupled to an output of the non-linear computation block;
a second summer including a first input coupled to the first output of the audio interface and a second input coupled to a first output of the non-linear crosstalk cancelling circuit;
a third summer including a first input coupled to the second output of the audio interface and a second input coupled to a second output of the non-linear crosstalk cancelling circuit;
a first digital to analog converter (DAC) including an input coupled to an output of the second summer; and
a second DAC including an input coupled to an output of the third summer.

12. A method, comprising:
generating first and second channel digital audio signals;
processing the first and second channel digital audio signals to generate first and second crosstalk-compensated digital audio signals, wherein processing the first and second channel digital audio signals comprises:
multiplying the first channel digital audio signal by a first coefficient to generate a first intermediate digital signal;
multiplying the second channel digital audio signal by a second coefficient to generate a second intermediate digital signal;
summing the first and second intermediate digital signals to generate a third intermediate signal;
squaring the third intermediate digital signal to generate a fourth intermediate digital signal; and
multiplying the fourth intermediate digital signal by a third coefficient to generate a fifth intermediate digital signal;
converting the first and second crosstalk-compensated digital audio signals into first and second analog audio signals, respectively; and
providing the first and second analog audio signals to first and second speakers having common terminals coupled to ground via a ground switch, respectively.

13. The method of claim 12, wherein:
the first coefficient is related to a first resistance across the second speaker; and
the second coefficient is related to a second resistance across the first speaker.

14. The method of claim 12, wherein the third coefficient is related to a non-linear resistance of the ground switch.

15. The method of claim 12, wherein processing the first and second channel digital audio signals further comprises:
summing the second intermediate signal with the fifth intermediate signal to generate a first crosstalk-cancelling digital signal;
summing the first intermediate signal with the fifth intermediate signal to generate a second crosstalk-cancelling digital signal;
summing the first crosstalk-cancelling digital signal with the first channel digital audio signal to generate the first crosstalk-compensated digital audio signal; and
summing the second crosstalk-cancelling digital signal with the second channel digital audio signal to generate the second crosstalk-compensated digital audio signal.

16. An apparatus, comprising:
means for generating first and second channel digital audio signals;
means for processing the first and second channel digital audio signals to generate first and second crosstalk-compensated digital audio signals, wherein the means for processing the first and second channel digital audio signals, comprises:
means for multiplying the first channel digital audio signal by a first coefficient to generate a first intermediate digital signal;
means for multiplying the second channel digital audio signal by a second coefficient to generate a second intermediate digital signal;
means for summing the first and second intermediate digital signals to generate a third intermediate signal;
means for squaring the third intermediate digital signal to generate a fourth intermediate digital signal; and
means for multiplying the fourth intermediate digital signal by a third coefficient to generate a fifth intermediate digital signal;
means for converting the first and second crosstalk-compensated digital audio signals into first and second analog audio signals, respectively; and
means for providing the first and second analog audio signals to first and second speakers having common terminals coupled to ground via a ground switch, respectively.

17. The apparatus of claim 16, wherein:
the first coefficient is related to a first resistance across the second speaker; and
the second coefficient is related to a second resistance across the first speaker.

18. The apparatus of claim 16, wherein the third coefficient is related to a non-linear resistance of the ground switch.

19. The apparatus of claim 16, wherein the means for processing the first and second channel digital audio signals further comprises:
means for summing the second intermediate signal with the fifth intermediate signal to generate a first crosstalk-cancelling digital signal;

means for summing the first intermediate signal with the fifth intermediate signal to generate a second crosstalk-cancelling digital signal;
means for summing the first crosstalk-cancelling digital signal with the first channel digital audio signal to generate the first crosstalk-compensated digital audio signal; and
means for summing the second crosstalk-cancelling digital signal with the second channel digital audio signal to generate the second crosstalk-compensated digital audio signal.

* * * * *